Aug. 18, 1964
V. J. LYONS
3,145,125
METHOD OF SYNTHESIZING III-V COMPOUND SEMICONDUCTOR EPITAXIAL LAYERS HAVING A SPECIFIED CONDUCTIVITY TYPE WITHOUT IMPURITY ADDITIONS
Filed July 10, 1961

INVENTOR
VINCENT J. LYONS
BY Allen A. Meyer, Jr.
ATTORNEY

United States Patent Office 3,145,125

Patented Aug. 18, 1964

3,145,125
METHOD OF SYNTHESIZING III–V COMPOUND SEMICONDUCTOR EPITAXIAL LAYERS HAVING A SPECIFIED CONDUCTIVITY TYPE WITHOUT IMPURITY ADDITIONS

Vincent J. Lyons, Mount Kisco, N.Y., assignor to International Business Machines Corporation, New York, N.Y., a corporation of New York Filed July 10, 1961, Ser. No. 123,406
19 Claims. (Cl. 148—175)

Figure 1:
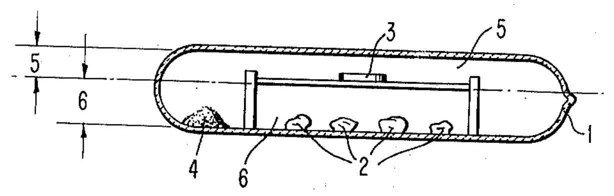

This invention relates to a process for synthesizing compound semiconductor crystals and to the selected particular conductivity type semiconductor crystals produced thereby. More particularly, it relates to the process of synthesizing compound semiconductor crystals composed of group III and group V element and to the "n" and/or "p" conductivity type compound semiconductor crystals formed by such a process.

The elemental semiconductors such as germanium and silicon have been thoroughly investigated and many techniques for fabricating crystalline bodies have been developed that may be utilized for semiconductor devices. An entirely new field of semiconductor device fabrication has opened since the discovery that compounds formed of many of the elements of group III and group V are known to have the properties of semiconductors. These compound semiconductors are known as III–V compounds, since each contains a constituent element from group III and a constituent element from group V of the periodic table. The elements boron (B), aluminum (Al), gallium (Ga) and indium (In) are representative of the class of group III elements in the periodic table and nitrogen (N), phosphorus (P), arsenic (As) and antimony (Sb) are representative of the group V class of elements. Certain of these III–V compounds and their properties have been intensely investigated. One such class of compounds includes the nitrides, phosphides, arsenides and antimonides of gallium and indium. It is to the synthesis and epitaxial growth of these compounds that the present invention is directed although not limited thereto.

In attempting to fabricate III–V compound semiconductor devices, it is of course necessary to develop techniques for producing compound semiconductor crystals from which these devices may be formed. Although it might be thought that previously developed techniques for fabricating the elemental semiconductor crystalline bodies might be quite readily applied to the formation of compound semiconductor crystals of the III–V compounds, this has not been the case because the chemical and physical properties of the compound semiconductor crystals differ greatly from those of the elemental semiconductors. Many practical problems are presented because the properties and attributes of the III–V compounds do not lend themselves to the simple application of well founded techniques. With respect to production of compound semiconductor crystals, the problem first has been to control the reaction; for example, halogen vapor transport reaction, to get epitaxial vapor growth. Single crystal epitaxial vapor growth on preferred substrates is exceptionally hard to facilitate. The reaction must be closely controlled in order to get epitaxy. This epitaxy relates to the single crystal growth on substrates of preferred orientation and crystallography. After one has obtained epitaxy the problem then arises as to how to control the refect concentration so as to control the conductivity type without adding impurities to the semiconductor material. Thus these two problems have prevented in the past obtaining and determining of a selected particular conductivity type for a compound semiconductor crystal. This problem of determining particular conductivity type is especially important in the production of compound semiconductor crystals. A way has now been found to control the defect concentration so that after one starts getting epitaxial growth the conductivity type may be determined or selected.

The present invention embodies or envisions as one of its embodiments the epitaxial growth of the compound semiconductors through vapor growth on preferred substrates. The exact mechanism which governs control of conductivity type in the synthesis and growth of the invention is not known for sure but it is thought to be due to the control of the defect concentration in the crystal. Accordingly, it is the object of the invention to facilitate the production of compound semiconductor crystals of a particular selected conductivity type.

Another object is to provide a technique for obtaining highly pure crystals of compound semiconductor materials.

Another object is to provide the growth of compound semiconductor crystals of "n" conductivity type.

Another object of the invention is to provide the growth of compound semiconductor crystals of "p" conductivity type.

Another object of the invention is to provide the growth compound semiconductor crystals of gallium arsenide having "n" conductivity type.

Another object of the invention is to provide for the growth of gallium arsenide having "p" conductivity type.

Another object of the invention is to provide a gallium arsenide diode of "n" conductivity type prepared by the process of this invention.

The foregoing and other objects, features and advantages of the invention will be apparent from the following more particular description of the preferred embodiments of the invention, as illustrated in the accompanying drawings.

In the drawings:

FIG. 1 relates to a sealed tube reaction chamber 1 prior to the start of the reaction showing source compound AB 2, monocrystalline substrate seed AB 3, and a halogen X 4. The tube is provided with separate temperature zones $T_1$ 5 and $T_2$ 6 with $T_2>T_1$.

Figure 2:
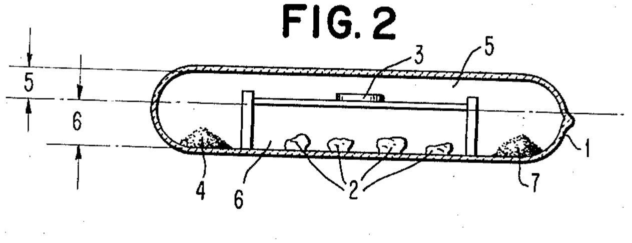

FIG. 2 relates to a sealed tube reaction chamber 1 prior to the start of the reaction showing source compound AB 2, monocrystalline substrate seed AB 3, a halogen X 4, element B 7, and separate temperature zones $T_1$ 5 and $T_2$ 6 with $T_2>T_1$.

Figure 3:
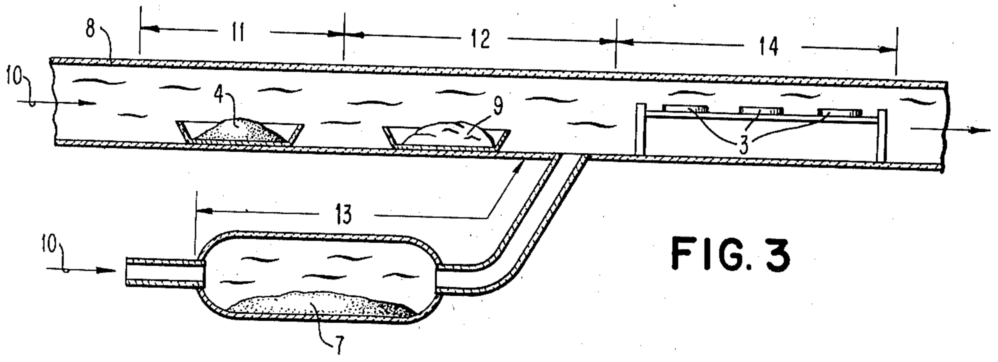

FIG. 3 relates to an open tube reaction chamber 8 showing a halogen X 4, element A 9, element B 7, monocrystalline substrate seeds AB 3, inert gas D 10 and separate temperature zones $T_3$ 11, $T_4$ 12, $T_5$ 13 and $T_6$ 14 with $T_4>T_6$.

Figure 4:
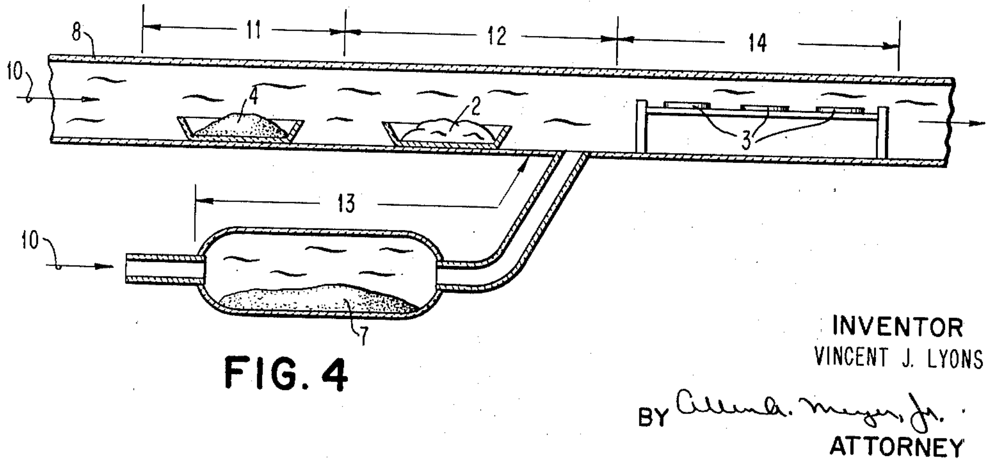

FIG. 4 relates to an open tube reaction chamber 8 showing a halogen X 4, compound AB 2, element B 7, monocrystalline substrate seeds AB 3, inert gas D 10 and separate temperature zones $T_3$ 11, $T_4$ 12, $T_5$ 13 and $T_6$ 14 with $T_4>T_6$.

The production of compound semiconductor crystals has always involved numerous problems. One of these problems has been first to obtain sufficient control of the reaction so as to get epitaxy. That is, single crystal growth on preferred substrates. The next problem that arise was that if one does get epitaxy how do you control the defect concentration so as to control the conductivity type without adding other elements such as impurities. This invention has solved this problem. The present invention relates to the preparation of compound semiconductor crystals of a selected particular conductivity type, that is either "n" or "p" conductivity type. The selected particular conductivity type can be controlled by the defect concentrations of the compound semiconductor crystals. The control of these defect concentrations is based upon control of the epitaxial vapor growth of the compound semiconductor crystal. A source of the material is placed in the vapor transport reaction chamber and a gas which is used as the vapor transport is placed in the chamber also. Heat is applied and the vapor transport reaction takes place, whereby epitaxially vapor grown crystals of the compound semiconductor crystal are formed. Some examples of typical vapor transport type reactions for monocrystalline semiconductor materials may be found in the I.B.M. Journal for Research and Development, vol. 4, No. 3, July 1960. Examples in which defect concentrations serve to control conductivity type are set forth below.

If, in a crystalline compound AB, one of the elements is present in excess of the concentration required by the simple stoichiometric ratio, the excess atoms can be accommodated in the crystal in three different ways:

(1) At interstitial $A_i$ or $B_i$.

(2) At normal lattice sites with the formulation of vacancies: $\Delta$ extra A atoms on A sites ($A_A$) giving $\Delta$ vacancies on B sites ($V_B$) and similarly $\lambda$ extra B atoms on B sites ($B_B$) giving $\lambda$ vacancies on A sites ($V_A$).

(3) At both A and B sites without the formation at vacancies.

In general, the simplest kind of equilibrium defect considered in compound AB is represented by case number 2 above. For this case, the number of defects in the crystal is limited by the solid solubility of the individual elements in the compound. In compounds of this type the solubility limits are generally assumed to be between $10^{19}$ and $10^{20}$ atoms/cc. In case number 2, $V_A$ will act as an acceptor and $V_B$ as a donor. This is to say that, using the example GaAa, an excess of arsenic will produce Ga-vacancies thus rendering "p" conductivity type material. An excess of gallium will produce As-vacancies thus giving "n" conductivity type material. Experimental evidence for this is seen in the AB compound PbS (J. Bloem and F. A. Kroger, J. Phys. Chem. of Solids I, 1, 1956) wherein an excess of Pb produces "n" conductivity type while an excess of S produces "p" conductivity type.

The following is a description of a process applicable to the preparation of III–V semiconductor compounds. Alternative methods are hereinafter set forth.

I. With source material (*a*) semiconducting compound AB wherein A is a group III–A element selected from the group Ga or In; (*b*) a halogen X which is an element of group III–A selected from the group Cl, Br, or I; (*c*) element B which is an element of group V.

II. With source materials (*a*) element A; (*b*) element B; and (*c*) halogen X.

Examples of the two processes are given for both the closed tube reaction chamber and the dynamic flow open tube reaction chamber.

EXAMPLE 1.—USING PROCESS (I) IN A SEALED TUBE WITH SOURCE MATERIALS COMPOUND AB AND HALOGEN X (NOTE FIG. 1)

A quartz reaction tube containing a monocrystalline seed wafer of compound AB, a quantity of source material which is compound AB, and a measured quantity of a halogen X, is evacuated and sealed. After heating the reaction tube to a constant temperature $T_1$ at the seed site and a constant temperature $T_2$ at the source site such that $T_2>T_1$, the steady state reaction proceeds to transport the source AB into the vapor phase and thence to the seed site where it is deposited epitaxially on the seed. The proposed disproportionation reaction is as follows:

$$AX_x \text{ (vapor)} + B_z \text{ (vapor)} \rightleftharpoons AB \text{ (solid)} + AX_y \text{ (vapor)}$$

wherein: $y>x$. (In a system of constant volume, the temperature will determine the relative quantities of $AX_x$, $AX_y$ and B vapors.) The reaction direction is toward the left at a higher temperature ($T_2$) and toward the right at lower temperatures ($T_1$).

The total pressure ($P_T$) of the system is:

$$P_T = P_{AX_x} + P_{AX_y} + P_{B_z}$$

The pressure of $P_{B_z}$ is:

$$P_{B_z} = \frac{1}{z} P_{AX_x} + \frac{1}{z} P_{AX_y}$$

The total number of moles of $AX_x$ and $AX_y$ is directly related to the number of moles of X added to the system, i.e., $$M_X = xAX_x + yAX_y$$

Thus, it is seen that the pressure of gaseous element B is a function of the quantity of X added to the system at constant volume. We can consider the reaction to include the vapor transport of element A via a halogen vapor transport reaction taking place in an atmosphere of gaseous element B. Thus, re-synthesis of the compound AB in the vicinity of the surface of the substrate crystal AB can occur under different pressure of element B depending on the concentration of $M_X$ initially incorporated in the reaction tube.

It is known that in the art of preparing crystals of binary compounds wherein one of the elements forming the compound has a higher vapor pressure than the other element, the number of vacancies incorporated in the crystal is a function of the pressure of the volatile element over the compound. It is known that the III–V compounds GaN, GaP, GaAs, GaSb, InN, InP, InAs, and InSb vaporize incongruently such that the group V–A element is more volatile than the group III–A element. Thus in the synthesis and crystal growth of these compounds it is possible to control defect formation by controlling the vapor pressure of the group V–A element.

In the vapor growth method illustrated by the example above, a re-synthesis occurs at the seed site. It has been shown that the vapor pressure of element B can be controlled through control of the initial concentration of halogen element X. Therefore it is possible to control the defect concentration (vacancy type and concentration) in the vapor grown compound AB through control of the initial X concentration. By selectively controlling the type of vacancy, the conductivity type of the crystal is controlled.

EXAMPLE 2.—USING PROCESS (I) IN A SEALED TUBE WITH SOURCE MATERIALS COMPOUND AB, HALOGEN X, AND ELEMENT B (NOTE FIG. 2)

This is similar to Example 1 except for two changes. The first change is that the concentration of halogen X will remain constant from tube to tube and the second change is that a quantity of element B will be selectively added to the reaction tubes. Changes in the vapor pressure of element B caused by adding different amount of the element B to the reaction tubes will result in changes in the defect concentration (vacancy concentration and type) in the expitaxially vapor grown compound AB. By selectively controlling the type of vacancy, the conductivity type of the crystal is controlled.

EXAMPLE 3.—USING PROCESS (II) IN AN OPEN TUBE DYNAMIC FLOW SYSTEM (NOTE FIG. 3)

Referring to FIG. 3, an inert gas D (such as for example He, Ne, Ar, Kr, Xe and Rn) is introduced into a quartz reaction tube at a constant flow rate. The inert gas D flows over a quantity of halogen X which is maintained at temperature $T_3$. The temperature and flow rate of the inert gas will then determine the quantity of X which is, at this point, introduced into the vapor phase. The inert gas then acts as a carrier to transport the vapor of X in a specific direction toward a second portion of the tube containing a quantity of element A which is maintained at a temperature $T_4$. The temperature $T_4$ is chosen such that halogen X reacts with element A so as to form in the gaseous phase two compounds $AX_x$ and $AX_y$. The temperature and flow rates will determine the relative quantities of $AX_x$ and $AX_y$. The gas train now contains vapor D, vapor $AX_x$ and vapor $AX_y$ and is directed toward the vapor growth chamber. In a separate tube connected to the tube described above there is contained a quantity of element B which is maintained at a temperature $T_5$. Inert gas D from a different source flows over element B some of which is caused to enter the vapor phase. The quantity of B in the vapor phase will be determined by the temperature $T_5$ and the inert gas flow rate. The vapor stream containing D and B then enters the vapor stream containing D, $AX_x$ and $AX_y$, and is carried toward the vapor growth chamber. The vapor growth chamber, which contains monocrystalline seeds of compound AB, is maintained at a temperature $T_6$ which is lower than temperature $T_4$. The change in temperature causes the ratio of vapors $AX_x$ and $AX_y$ to change through a disproportionation type reaction so as to form a higher ratio of $AX_y$ to $AX_x$ and in the presence of vapor B the reaction proceeds to cause the compound AB to be synthesized and grown epitaxially on the monocrystalline AB compound substrate seeds. The reaction proposed is similar to that illustrated for Example 1 wherein compound AB is caused to deposit epitaxially on the AB seeds at lower temperatures. The defect concentration in the vapor grown material is again controlled through controlling the vapor phase proportions. The vapor phase proportions, that is, the relative partial pressures of the reactive constituents, may be independently controlled in this system through independent temperature controls and gas flow rate control.

EXAMPLE 4.—USING PROCESS (II) IN AN OPEN TUBE DYNAMIC FLOW SYSTEM (NOTE FIG. 4)

The reaction is similar to that of Example 3 except that in place of element A in temperature zone $T_4$, a quantity of compound AB is used. Thus halogen X reacts with compound AB forming three vapor species $AX_x$, $AX_y$, and B. The exact proportions of the vapor species are a function of the quantity of X, the temperature $T_4$ and the gas flow rate. Additional quantities of element B may be introduced in the same manner described in Example 3. It is seen that the independent controls of the system will provide control of the defect concentrations in the deposited compound AB and thus provide control of the conductivity type of the crystal.

EXAMPLE 5.—VAPOR GROWTH OF GaAs "n" CONDUCTIVITY TYPE

Substrate seed: GaAs single crystal wafer, 0.020 inch thick, 0.625 inch in diameter, cut parallel to the (III) crystallographic plane. Dislocation concentration$=5\times10^4$ cm.$^{-2}$.

Source compound: 1 gm. of undoped GaAs.

Halogen: 56 mg. of iodine.

The substrate seed, source compound and halogen are positioned as shown in FIG. 1. The quartz reaction tube has an outside diameter of $\approx$24 mm. and an inside diameter of $\approx$22 mm. After evacuation and sealing of the quartz tube, the tube volume is 38±2 cc. The tube is placed in a furnace which provides a substrate temperature of 635° C. and a source temperature of 663° C. The reaction proceeds to transfer GaAs from the source compound to the substrate seed where the GaAs is grown epitaxially on the seed wafer. After 45.5 hours the grown crystal thickness is 0.25 mm. The crystal was "n" conductivity type with an electron concentration of $6\times10^{15}$ cm.$^{-3}$ and an electron mobility of 3090 cm.$^2$/volt-sec.

EXAMPLE 6.—VAPOR GROWTH OF GaAs "p" CONDUCTIVITY TYPE

The materials are exactly the same as in Example 1, except that the quantity of iodine was increased to 170 mg. After the experiment, the epitaxially grown GaAs was found to be "p" conductivity type with a hole concentration of $2.4\times10^{16}$ cm.$^{-3}$ and a hole mobility of 304 cm.$^2$/volt-sec. It is assumed that the initial reaction of iodine with the GaAs source proceeds to form the species $GaI_3$, GaI and $As_4$. The reaction at steady state would be:

$$3GaI\ (v.)+\tfrac{1}{2}As_4\ (v.)\rightleftharpoons 2GaAs\ (s.)+GaI_3\ (v.)$$

In a disproportionation reaction of this kind, the reaction proceeds toward the right at low temperatures and toward the left at high temperatures. The equilibrium constant for the reaction in the vapor phase is:

$$K_p=\frac{P_{GaI_3}}{(P_{GaI})^3(P_{As_4})^{1/2}}$$

Table I shows the values of total pressure ($P_T$) and the pressures of the three individual gaseous species, both as a function of the initial iodine concentration and as a function of temperature.

*Table I*

| T. ° C. | Run #1 $n_I=4.14\times10^{-4}$ mole | | | | Run #2 $n_I=7.90\times10^{-4}$ mole | | | |
|---|---|---|---|---|---|---|---|---|
| | $P_T$ | $P_{GaI}$ | $P_{GaI_3}$ | $P_{As_4}$ | $P_T$ | $P_{GaI}$ | $P_{GaI_3}$ | $P_{As_4}$ |
| 561 | 162 | 4.6 | 125 | 32.4 | 290 | 3 | 229 | 58 |
| 636 | 180 | 9.2 | 134.8 | 36.0 | 324 | 12.2 | 247 | 64.8 |
| 727 | 212 | 30.8 | 138.8 | 42.4 | 380 | 40 | 264 | 76 |
| 801 | 284 | 96.0 | 131.2 | 56.8 | 460 | 107.5 | 260.5 | 92.0 |
| 890 | 455 | 281.3 | 82.7 | 91.0 | 700 | 358.5 | 201.5 | 140 |

(Data obtained from vapor pressure measurements.)

Thus, we see that at 636° C., the arsenic pressure for $n_I=4.14\times10^{-4}$ mole, where $n_I$ represents the initial iodine concentration is 36 mm. while for $n_I=7.90\times10^{-4}$ mole, the arsenic pressure is 64.8 mm. at the same temperature.

The reaction may be considered to be one in which the Ga is transported through a Ga–I disproportionation reaction. This reaction proceeds in an arsenic atmosphere such that re-synthesis of the compound occurs at the substrate surface. In a pure system, the arsenic pressure controls the conductivity type through control of the defect concentration.

Table II shows the variations in type, carrier concentration and mobility as a function of increasing iodine and/or arsenic concentration.

*Table II*

Substrate $T=617\pm4°$ C.; $\Delta T=27°$ C.
GaAs seeds: "n" type cut parallel to (III) plane
GaAs source: "n" type single crystal ($N_d-N_a=1.13\times10^{17}$), $\mu_H=4570$

| Wt. of I, mg. | Run Duration, hours | Deposit Thickness, mm. | 300° K. | | 77° K. | |
|---|---|---|---|---|---|---|
| | | | Net Carrier Concentration | $\mu_H$ | Net Carrier Concentration | $\mu_H$ |
| 15 | 113.0 | (1) | (1) | (1) | (1) | (1) |
| 35 | 91.5 | 0.124 "n" type | $3.6\times10^{16}$ | 3,186 | $2.77\times10^{16}$ | 5,370 |
| 53 | 67.0 | 0.160 "n" type | $4.2\times10^{15}$ | 3,420 | $2.9\times10^{15}$ | 6,220 |
| 91 | 89.0 | 0.231 "n" type | $1.5\times10^{16}$ | 3,675 | $1.1\times10^{16}$ | 6,270 |
| 189 | 90.0 | 0.285 "n" type | $4.5\times10^{15}$ | 5,565 | $3.4\times10^{15}$ | 12,621 |
| 149 plus 30.3 mg. of As. | 63.5 | "p" type | $3.8\times10^{15}$ | 172 | $9.7\times10^{14}$ | 435 |

[1] Only spotty epitaxial deposition on seed; some GaAs wetted quartz.

Table II shows that as initial iodine concentration is increased, the resultant vapor grown GaAa shows an increase in electron mobility and a general decrease in carrier concentration up to an iodine weight of 189 mg. These data show that the vapor phase composition is influencing the vacancy concentration in the vapor grown GaAs since no impurity elements have been added to the system. Referring now to FIG. 2, it is shown that it is possible to add a quantity of element B to the reaction tube so as to change the vapor phase composition and influence the defect concentration of the vapor grown GaAs. An example of this is shown in Table II. An experiment was carried out wherein 149 mg. of iodine was added to the reaction tube. This would have resulted in the formation of "n" conductivity type vapor grown GaAs. However, 30.3 mg. of arsenic was also added to the tube. The effect of adding the arsenic was to produce "p" conductivity type GaAs. That is, using 149 mg. of iodine, the arsenic pressure in the tube would be approximately 120 mm. However, the additional arsenic added to the tube increased the arsenic pressure to approximately 275 mm. Hence, "p" type GaAs was obtained.

EXAMPLES 7 AND 8.—OPEN TUBE REACTION CHAMBER (FIGURE 3)

Inert gas: helium
Halogen: iodine
Element A: gallium
Element B: arsenic
Monocrystalline AB: GaAs Helium is passed into the reaction tube and over the iodine which is heated to a temperature so as to provide a specific concentration of iodine vapor. The iodine vapor is carried in the helium stream over the Ga which is at a temperature of approximately 650° C. Reaction of the iodine with the Ga under equilibrium conditions provides for the formation of two gallium-iodides. The concentrations of the iodides will depend on the iodine concentration and the temperature. In this case, the pressures of the iodides formed are:

$$P_{GaI_3}=320.8 \text{ mm. and } P_{GaI}=8.3 \text{ mm.}$$

Helium is passed over the arsenic, which is heated to a temperature so as to provide a pressure of 82 mm. This stream is then introduced into the helium-gallium idoides stream, and all of the vapors are then carried to a region containing the GaAs substrate seeds. This region is at a temperature of 617° C. The lower temperature causes the proportions of the gallium-iodide compounds to change so as to produce more $GaI_3$ and less GaI. This reaction provides elemental gallium. When the reaction proceeds in the arsenic vapor the result is to cause epitaxial growth of "n" conductivity type GaAs on the GaAs substrate seeds.

Under the same conditions of gallium iodide pressures, but with an arsenic pressure of 270 mm. "p" conductivity type GaAs is epitaxially grown on the substrate seeds.

EXAMPLES 9 AND 10.—OPEN TUBE REACTION CHAMBER (FIGURE 4)

The only change in the system is that GaAs is substituted for the element Ga.

In producing "n" conductivity type GaAs, the temperature would be the same as in the preceding example, thus providing the same $GaI_3$, GaI, and $As_4$ pressures, but no extra arsenic would be added to the system. To epitaxially grow "p" conductivity type GaAs, arsenic would be added to the system in a sufficient quantity to provide a total arsenic pressure of 275 mm.

EXAMPLE 11

The procedure of Example 5 is followed except that chlorine is substituted for the iodine. A GaAs crystal of "n" conductivity type results.

EXAMPLE 12

The procedure of Example 5 is followed except that bromine and indium antimonide are substituted for the iodine and gallium arsenide. An InSb crystal of "n" conductivity type results.

EXAMPLE 13

The procedure of Example 5 is followed except that gallium antimonide is substituted for gallium arsenide. A GaSb crystal of "n" conductivity type results.

EXAMPLE 14

The procedure of Example 5 is followed except that bromine and gallium nitride are substituted for the iodine and gallium arsenide. A GaN crystal of "n" conductivity type results.

EXAMPLE 15

The procedure of Example 5 is followed except that indium phosphide is substituted for the gallium arsenide. An InP crystal of "n" conductivity type results.

EXAMPLE 16

The procedure of Example 5 is followed except that bromine and indium arsenide are substituted for the iodine and gallium arsenide. An InAs crystal of "n" conductivity type results.

EXAMPLE 17

The procedure of Example 5 is followed except that chlorine and gallium phosphide are substituted for the iodine and gallium arsenide. A GaP crystal of "n" conductivity type results.

EXAMPLE 18

The procedure of Example 5 is followed except that indium nitride is substituted for the gallium arsenide. An indium nitride crystal of "n" conductivity type results.

One of the advantages of the invention lies in the fabrication of a pn junction in the material gallium arsenide without the introduction of a conductivity type determining impurity. Such a structure yields a gallium arsenide diode which is not encumbered by the problems in the art which have been encountered by the introduction of elemental impurities such as zinc into gallium arsenide which resulted in later failure of these devices in service.

While the invention has been particularly shown and described with reference to preferred embodiments thereof, it will be understood by those skilled in the art that various changes in form and details may be made therein without departing from the spirit and scope of the invention.

What is claimed is:

1. An epitaxially grown III–V semiconductor crystal selected from the group consisting of GaN, GaP, GaAs, GaSb, InN, InP, InAs, and InSb having a sufficient Group III constituent vacancy concentration to impart "p" conductivity type to said crystal.

2. An epitaxially grown III–V semiconductor crystal selected from the group consisting of GaN, GaP, GaAs, GaSb, InN, InP, InAs, and InSb having a sufficient Group V constituent vacancy concentration to impart "n" conductivity type to said crystal.

3. An epitaxially grown GaAs semiconductor crystal having a sufficient Ga vacancy concentration to impart "p" conductivity type to said crystal.

4. An epitaxially grown GaAs semiconductor crystal having a sufficient As vacancy concentration to impart "n" conductivity type to said crystal.

5. An epitaxially grown InSb semiconductor crystal having a sufficient Sb vacancy concentration to impart "n" conductivity type to said crystal.

6. An epitaxially grown GaSb semiconductor crystal having a sufficient Sb vacancy concentration to impart "n" conductivity type to said crystal.

7. An epitaxially grown GaN semiconductor crystal having a sufficient N vacancy concentration to impart "n" conductivity type to said crystal.

8. An epitaxially grown InP semiconductor crystal having a sufficient P vacancy concentration to impart "n" conductivity type to said crystal.

9. An epitaxially grown InAs semiconductor crystal having a sufficient As vacancy concentration to impart "n" conductivity type to said crystal.

10. An epitaxially grown GaP semiconductor crystal having a sufficient P vacancy concentration to impart "n" conductivity type to said crystal.

11. An epitaxially grown InN semiconductor crystal having a sufficient N vacancy concentration to impart "n" conductivity type to said crystal.

12. A method of synthesizing III–V compound semiconductor crystals through epitaxial vapor growth involving a halogen vapor transport reaction in connection with a substrate which comprises the step of: increasing relative partial pressure of one of reactive constituents of said halogen vapor transport reaction in the immediate vicinity of the surface of said substrate to selectively control vacancy concentrations of the compound constituents of said semiconductor crystals so as to impart a specified conductivity type to said crystals.

13. A method of synthesizing III–V compound crystals through epitaxial vapor growth involving a halogen vapor transport reaction in connection with a substrate, said III–V compound being selected from the group consisting of GaN, GaP, GaAs, GaSb, InN, InP, InAs and InSb which comprises the step of: increasing relative partial pressure of one of reactive constituents of said halogen vapor transport reaction in the immediate vicinity of the surface of said substrate to selectively control vacancy concentrations of the compound constituents of said semiconductor crystals so as to impart a specified conductivity type to said crystals.

14. The method of claim 13 wherein said specified conductivity type is "n" and "p" conductivity type in contiguous zones.

15. The method of claim 13 wherein said specified conductivity type is "n" conductivity type.

16. The method of claim 13 wherein said specified conductivity type is "n" conductivity type.

17. A method of synthesizing gallium arsenide semiconductor crystals through epitaxial vapor growth involving a halogen vapor transport reaction in connection with a substrate which comprises the step of: increasing relative partial pressure of one of reactive constituents of said halogen vapor transport reaction in the immediate vicinity of the surface of the substrate to selectively control the vacancy concentrations of the gallium and arsenic constituents of said semi-conductive crystals so as to impart a specified conductivity type.

18. The method of claim 17 wherein said specified conductivity is "n" conductivity type.

19. The method of claim 17 wherein said specified conductivity is "*p*" conductivity type.

References Cited in the file of this patent

UNITED STATES PATENTS

| | | |
|---|---|---|
| 2,692,839 | Christensen | Oct. 26, 1954 |
| 2,759,861 | Collins | Aug. 21, 1956 |
| 2,772,654 | Herkant | Dec. 4, 1956 |
| 2,933,384 | Welker | Apr. 19, 1960 |
| 2,989,941 | Wolf | June 27, 1961 |

FOREIGN PATENTS

| | | |
|---|---|---|
| 1,029,941 | Germany | May 14, 1958 |